(12) United States Patent
Furuya et al.

(10) Patent No.: US 7,389,191 B2
(45) Date of Patent: Jun. 17, 2008

(54) APPARATUS AND METHOD FOR S-PARAMETER CALCULATION, AND PROGRAM AND RECORDING MEDIUM THEREOF

(75) Inventors: Sachiko Furuya, Kawasaki (JP); Tetsuyuki Kubota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 126 days.

(21) Appl. No.: 11/041,246

(22) Filed: Jan. 25, 2005

(65) Prior Publication Data

US 2005/0216239 A1   Sep. 29, 2005

(30) Foreign Application Priority Data

Mar. 25, 2004 (JP) .............................. 2004-088478

(51) Int. Cl.
  *G01R 27/32* (2006.01)
(52) U.S. Cl. .................. 702/65; 324/638; 324/683; 702/57; 702/90
(58) Field of Classification Search ................. 702/57, 702/65, 108, 117, 90; 324/601, 638, 683
See application file for complete search history.

(56) References Cited

U.S. PATENT DOCUMENTS 6,744,262 B2 *  6/2004  Adamian .................... 324/638
6,757,625 B2 *  6/2004  Adamian et al. ............. 702/57
2005/0256658 A1 * 11/2005  Anderson .................... 702/90

FOREIGN PATENT DOCUMENTS

JP      2001-242207         9/2001

* cited by examiner

*Primary Examiner*—John E. Barlow, Jr.
*Assistant Examiner*—John H Le
(74) *Attorney, Agent, or Firm*—Staas & Halsey LLP

(57) ABSTRACT

According to the present invention an S-parameter file input section inputs S-parameters for each device constituting a system subject to a transmission analysis, a port position correspondence conversion section converts the input S-parameters so as to correspond to preset port positions to be connected, an S-parameter/T-parameter conversion section converts S-parameters to T-parameters, a connection calculation section carries out a connection calculation of T-parameters to obtain T-parameters of the entire system, a T-parameter/S-parameter conversion section converts T-parameters of the entire system to S-parameters of the entire system and an S-parameter file output section outputs S-parameters of the entire system.

5 Claims, 17 Drawing Sheets

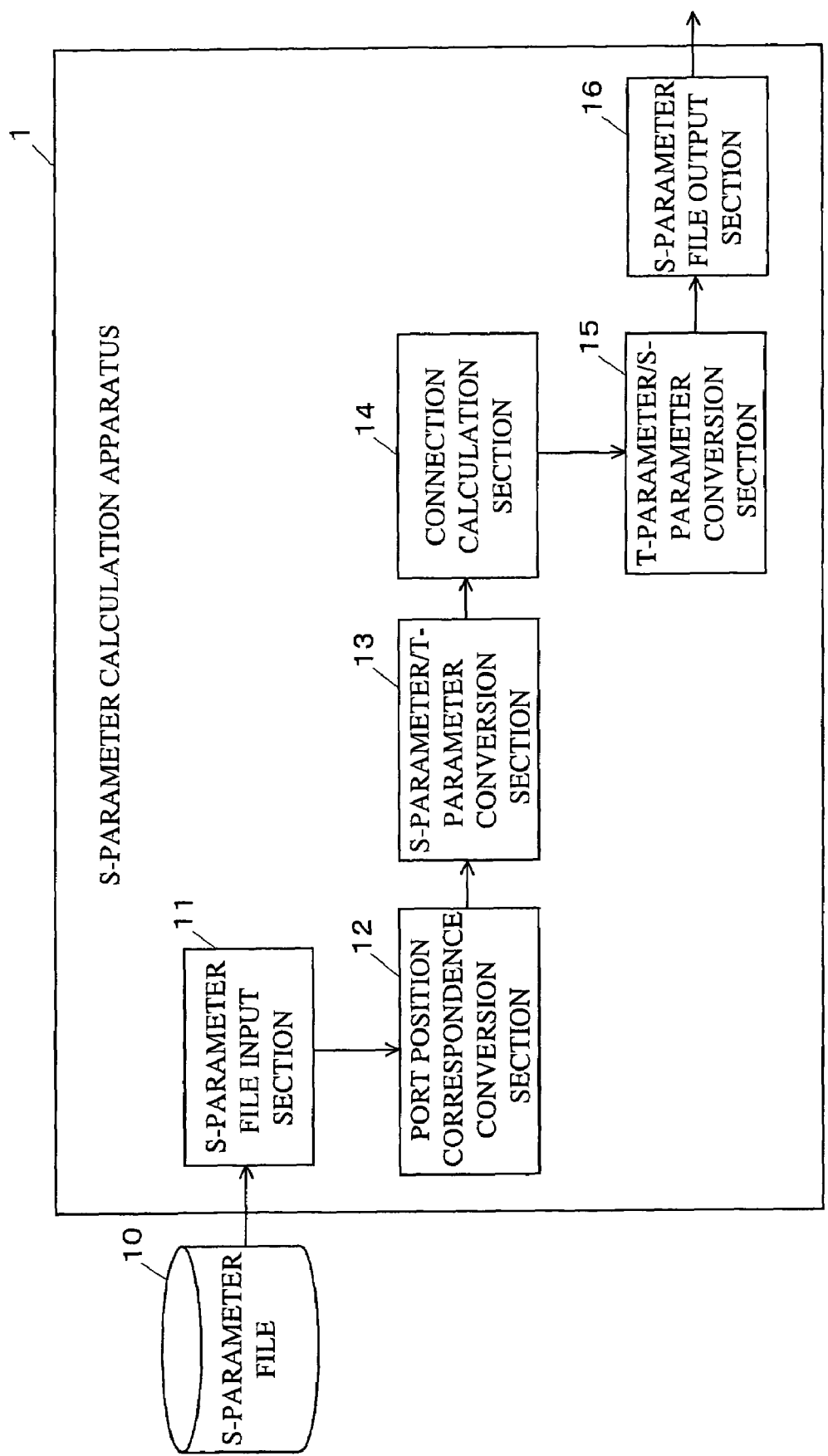

FIG. 3

DATA STRUCTURE OF S-PARAMETER FILE

| Freq. | $S_{11}$(Mag, Ang) $S_{12}$(Mag, Ang) $S_{13}$(Mag, Ang) $S_{14}$(Mag, Ang)<br>$S_{21}$(Mag, Ang) $S_{22}$(Mag, Ang) $S_{23}$(Mag, Ang) $S_{24}$(Mag, Ang)<br>$S_{31}$(Mag, Ang) $S_{32}$(Mag, Ang) $S_{33}$(Mag, Ang) $S_{34}$(Mag, Ang)<br>$S_{41}$(Mag, Ang) $S_{42}$(Mag, Ang) $S_{43}$(Mag, Ang) $S_{44}$(Mag, Ang) |
|---|---|

Freq. = Frequency   Mag = Magnitude
Ang = Angle

FIG. 4

S-PARAMETER $$\begin{pmatrix} b_1 \\ b_2 \\ b_3 \\ b_4 \end{pmatrix} = \begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix} \begin{pmatrix} a_1 \\ a_2 \\ a_3 \\ a_4 \end{pmatrix}$$

CONVERSION $\Rightarrow$

T-PARAMETER $$\begin{pmatrix} b_1 \\ b_3 \\ a_1 \\ a_3 \end{pmatrix} = \begin{pmatrix} T_{11} & T_{12} & T_{13} & T_{14} \\ T_{21} & T_{22} & T_{23} & T_{24} \\ T_{31} & T_{32} & T_{33} & T_{34} \\ T_{41} & T_{42} & T_{43} & T_{44} \end{pmatrix} \begin{pmatrix} a_4 \\ a_2 \\ b_4 \\ b_2 \end{pmatrix}$$

$$S = \begin{pmatrix} S_{11} & S_{14} & S_{12} & S_{13} \\ S_{41} & S_{44} & S_{42} & S_{43} \\ S_{21} & S_{24} & S_{22} & S_{23} \\ S_{31} & S_{34} & S_{32} & S_{33} \end{pmatrix}$$

INPUT FILE PORT POSITION

⇩ REARRANGE AND CONVERT MATRIX ACCORDING TO CODE-SET PORT POSITION $$S = \begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix}$$

CODE-SET PORT POSITION $$\begin{bmatrix} \text{TRANSMISSION} \\ \text{REFLECTION} \\ \text{CROSSTALK} \end{bmatrix} = \begin{pmatrix} S_{11} & \cdots & S_{14} \\ \vdots & & \vdots \\ \vdots & & \vdots \\ S_{41} & \cdots & S_{44} \end{pmatrix} \begin{bmatrix} \text{INPUT} \end{bmatrix}$$

OUTPUT             S-PARAMETER

210 MEASURING SYSTEM

112 CONNECTOR

CONNECTION OF S-PARAMETERS ON SPICE MODEL

APPARATUS AND METHOD FOR S-PARAMETER CALCULATION, AND PROGRAM AND RECORDING MEDIUM THEREOF

BACKGROUND OF THE INVENTION

1. Field of the Invention

The present invention relates to an S-parameter calculation technology used to design a high-frequency circuit and so on, and more particularly, to an apparatus and method for S-parameter calculation, and program and recording medium thereof, capable of accurately calculating S-parameters of an entire system made up of a plurality of devices and calculating S-parameters of arbitrary lengths of a single device having a large aspect ratio such as a cable or wiring.

2. Description of the Related Art

First, S-parameters will be explained. S-parameters are parameters indicating a relationship between inputs and outputs of a circuit. When there is an input from a port 1 of a circuit with 4 port terminals as shown in FIG. 13, outputs corresponding to certain characteristics appear at respective ports from port 1 to port 4. These characteristics are reflection for the port 1, transmission for the port 3 and crosstalk for the port 2 and port 4.

The relationship between the input and outputs of transmission, reflection and crosstalk of the circuit shown in FIG. 13 can be expressed in a form of a matrix calculation shown in FIG. 14. The matrix elements ($S_{11}$ to $S_{44}$) of the matrix (complex matrix) in FIG. 14 expressing the relationship between the input and output of the circuit are S-parameters. To be exact, S-parameters indicate relationships between absolute values of voltages and phases among ports.

Inputs/outputs of a circuit with 4 port terminals shown in FIG. 15 will be explained as an example. In the figure, suppose numerals 1 to 4 attached to the respective ports denote port numbers and $a_i$ ($1 \leq i \leq 4$) denotes an input from each port and $b_i$ ($1 \leq i \leq 4$) denotes an output of each port.

The relationship between inputs and outputs of the circuit with 4 port terminals shown in FIG. 15 can be expressed by a complex matrix whose matrix elements consist of S-parameters $S_{11}$ to $S_{44}$ as:

$$\begin{pmatrix} b_1 \\ b_2 \\ b_3 \\ b_4 \end{pmatrix} = \begin{pmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{pmatrix} \begin{pmatrix} a_1 \\ a_2 \\ a_3 \\ a_4 \end{pmatrix}$$

S-parameters can be extracted through a three-dimensional electromagnetic field analysis and actual measurement. A transmission analysis using S-parameters is performed using SPICE which is a general circuit simulation tool. SPICE performs a transmission analysis by incorporating input S-parameters.

When S-parameters of an entire system to which a plurality of devices are connected are calculated, attempting to extract S-parameters by regarding the entire system as a simulation target using a technique based on a three-dimensional electromagnetic field analysis would cause the simulation scale to become too large to calculate S-parameters.

Therefore, the technique based on the three-dimensional electromagnetic field analysis involves a problem that it is not possible to extract S-parameters of the entire system at a time.

For example, as shown in FIG. 16, when a system which comprises an LSI 110, a BGA (Ball Grid Array) 111, a connector 112, a BP (back panel) 113, a Via (not shown) provided for the BP 113, a PCB (printed circuit board) 114 and wiring 115 are subjected to a three-dimensional electromagnetic field analysis, the number of meshes and a calculation time increase, and therefore it is not possible to extract S-parameters of the entire system at a time.

Furthermore, S-parameters of a device having a large aspect ratio such as wiring or a cable as shown in FIG. 17, for example, cannot be extracted through a three-dimensional electromagnetic field analysis with sufficient accuracy and should be actually measured every time the length of the wiring or cable and so on is changed.

On the other hand, in the case of the technique based on actual measurements, as shown in FIG. 18, for example, when measuring systems 210 such as probes are attached on and beneath a connector 112 to measure S-parameters of the connector 112, S-parameters including not only the S-parameters of the connector 112 but also the S-parameters of the measuring systems 210 are measured, causing a problem that the accuracy in extracting S-parameter of the connector 112 itself degrades.

Furthermore, there is another problem that it is difficult to measure S-parameters of a device having a large aspect ratio such as a cable or wiring.

As shown above, it has been conventionally difficult to calculate S-parameters of an entire system made up of a plurality of devices, and therefore when carrying out a transmission analysis of the entire system, the conventional technology performs a transmission analysis by extracting S-parameters of single devices individually and connecting the extracted S-parameters on a SPICE model.

For example, the conventional technology performs a three-dimensional electromagnetic field analysis on the LSI 110, BGA 111, wiring 115 and connector 112 shown in FIG. 16 separately, extracts S-parameters device by device, connects the S-parameters of the respective devices on a SPICE model as shown in FIG. 19 and performs a transmission analysis of the entire system as shown in FIG. 16.

By using FIG. 20A, FIG. 20B and FIG. 21, the conventional technology will be explained more specifically. Suppose S-parameters of a test coupon 211 as shown in FIG. 20A are extracted and a transmission analysis using SPICE is performed. In FIG. 20A, reference numeral 212 denotes a probe and 115 denotes wiring. FIG. 20B is a cross-sectional view of the test coupon 211 shown in FIG. 20A. The notation "SUS" of the test coupon 211 shown in FIG. 20B denotes a stainless steel portion.

As shown in FIG. 20A, the S-parameter extraction target range corresponds to the portion having a length of 4 cm which corresponds to the wire length of the wiring 115. Since the S-parameter extraction target range is long, it is not possible to realize a three-dimensional electromagnetic field analysis as a single model. Therefore, the test coupon 211 is divided into two areas; left portion and right portion and S-parameters of the respective areas are extracted.

FIG. 21 illustrates a principle of the conventional technology. Of the divided test coupon 211, S-parameters of the left portion and S-parameters of the right portion are extracted individually through a three-dimensional electromagnetic field analysis. Then, SPICE models are created from the extracted S-parameters of the left portion and S-parameters of the right portion respectively and both SPICE models are connected and subjected to a transmission analysis.

There is no document describing a technology for carrying out a transmission analysis of an entire system which automatically calculates S-parameters of the entire system using connection codes based on a plurality of S-parameters, obtains S-parameters of the entire system and then creates a SPICE model.

When a transmission analysis is performed using the conventional technology, inverse FFT (Fast Fourier Transform) shown in Formula 1 below is performed as many times as the number of S-parameters connected on the SPICE model.

$$Y(t) = \int_{-\infty}^{t} S(\tau)x(t-\tau)d\tau \quad \text{Formula 1}$$

Formula 1 can be expressed as shown in Formula 2 in discrete areas.

$$Y(n\Delta t) = \sum_{k=-(N-1)}^{0} S(k\Delta t)x((n-k)\Delta t) \quad \text{Formula 2}$$

Since the conventional technology connects S-parameters on a SPICE model and performs the integral calculation in Formula 2 repeatedly, errors may be accumulated producing so many errors that affect a transmission analysis. Therefore, it is difficult to perform an accurate transmission analysis.

FIG. 22 shows results of a transmission analysis conducted on the test coupon 211 shown in FIG. 20A by extracting S-parameters of the test coupon on the left portion and right portion as shown in FIG. 21 using the conventional technology and by creating SPICE models from the respective S-parameters. A thin line in the figure shows a measured value and a thick line shows the result of the transmission analysis using SPICE. As shown in the area encircled with a dotted line in FIG. 22, when a SPICE transmission analysis is performed using the conventional technology, it is observed that errors (disturbances of waveform) have occurred.

Furthermore, the conventional technology cannot calculate S-parameters of arbitrary lengths from some S-parameters of a single device having a large aspect ratio such as a cable or wiring.

SUMMARY OF THE INVENTION

It is an object of the present invention to provide means for calculating S-parameters capable of solving the above described problems of the conventional technology, calculating S-parameters of an entire system made up of a plurality of devices accurately and calculating S-parameters of arbitrary lengths of a single device having a large aspect ratio such as a cable or wiring.

The present invention adopts a technique which will be explained below. FIG. 1 illustrates a principle of the present invention. For example, when a transmission analysis on the test coupon 211 shown in FIG. 20A is performed, the present invention carries out connection calculation of S-parameters of the left portion and S-parameters of the right portion of the test coupon 211 which have been extracted individually through a three-dimensional electromagnetic field analysis or actual measurement and calculates S-parameters of the entire test coupon 211.

A transmission analysis by SPICE using S-parameters of the entire test coupon 211 calculated by the present invention requires execution of the inverse FFT shown in Formula 2 only one time, and can thereby perform a transmission analysis with minimum errors and perform a transmission analysis with high accuracy.

That is, the present invention is an S-parameter calculation apparatus for calculating S-parameters of an entire system made up of a plurality of same or different devices. The apparatus comprises input means for inputting S-parameters for each of said devices, port position correspondence conversion means for converting the input S-parameters so as to correspond to preset port positions of each of said devices, S-parameter/T-parameter conversion means for converting said converted S-parameters to T-parameters for each of said devices, calculation means for carrying out a matrix calculation using the T-parameters for each of said devices and calculating T-parameters of said entire system, T-parameter/S-parameter conversion means for converting said calculated T-parameters of the entire system to S-parameters of the entire system, and output means for outputting the S-parameters of the entire system obtained by said T-parameter/S-parameter conversion means.

Furthermore, the present invention is an S-parameter calculation apparatus for calculating S-parameters of a single device having a length N times (N represents an arbitrary integer of value of 2 or more) a certain length L. The apparatus comprises input means for inputting the S-parameters of said single device having a length of L, port position correspondence conversion means for converting the input S-parameters so as to correspond to preset port positions when said single device is connected, S-parameter/T-parameter conversion means for converting said converted S-parameters to T-parameters, calculation means for carrying out a matrix calculation using said T-parameters, repeating (N−1) times a process of calculating T-parameters of a single device having a length corresponding to the length of said single devices having a length of L sequentially connected and calculating T-parameters of a single device having a length of L×N, T-parameter/S-parameter conversion means for converting said calculated T-parameters of said single device having a length of L×N to S-parameters of a single device having a length of L×N, and output means for outputting S-parameters of said single device having the length of L×N obtained by said T-parameter/S-parameter conversion means.

Furthermore, the present invention is a method for calculating S-parameters of an entire system made up of a plurality of same or different devices. The method comprises inputting S-parameters for each of said devices, converting the input S-parameters so as to correspond to preset port positions of each of said devices, converting said converted S-parameters to T-parameters for each of said devices, carrying out a matrix calculation using the T-parameters for each of said devices and calculating T-parameters of said entire system, converting said calculated T-parameters of the entire system to S-parameters of the entire system, and outputting the S-parameters of the entire system obtained by converting T-parameters of said entire system to S-parameters of the entire system.

Furthermore, the present invention is an S-parameter calculation program for calculating S-parameters of an entire system made up of a plurality of same or different devices. The program causes a computer to execute inputting S-parameters for each of said devices, converting the input S-parameters so as to correspond to preset port positions of each of said devices, converting said converted S-parameters to T-parameters for each of said devices, carrying out a matrix calculation using the T-parameters for each of said devices and calculating T-parameters of said entire system, converting said calculated T-parameters of the entire system to S-parameters of the entire system, and outputting the S-parameters of the entire system obtained by converting T-parameters of said entire system to S-parameters of the entire system.

Furthermore, the present invention is a computer-readable recording medium recording an S-parameter calculation program for calculating S-parameters of an entire system made up of a plurality of same or different devices. The program causes a computer to execute inputting S-parameters for each of said devices, converting the input S-parameters so as to correspond to preset port positions of each of said devices, converting said converted S-parameters to T-parameters for each of said devices, carrying out a matrix calculation using the T-parameters for each of said devices and calculating T-parameters of said entire system, converting said calculated T-parameters of the entire system to S-parameters of the entire system, and outputting the S-parameters of the entire system obtained by converting T-parameters of the entire system to S-parameters of the entire system.

The present invention calculates S-parameters of an entire system made up of a plurality of devices with high accuracy. Therefore, according to the present invention, it is possible to perform an analysis faster and more accurately than a conventional technology which performs a transmission analysis by converting S-parameters of each device into a SPICE model individually.

Furthermore, according to the present invention, it is possible to calculate S-parameters of arbitrary lengths even for a single device having a large aspect ratio such as a cable or wiring.

BRIEF DESCRIPTION OF THE DRAWINGS

FIG. 2 illustrates an example of the structure of an S-parameter calculation apparatus.

FIG. 3 illustrates an example of the data structure of an S-parameter file.

FIG. 4 illustrates a conversion from S-parameters to T-parameters.

DETAILED DESCRIPTION OF THE PREFERRED EMBODIMENTS

Figure 1:
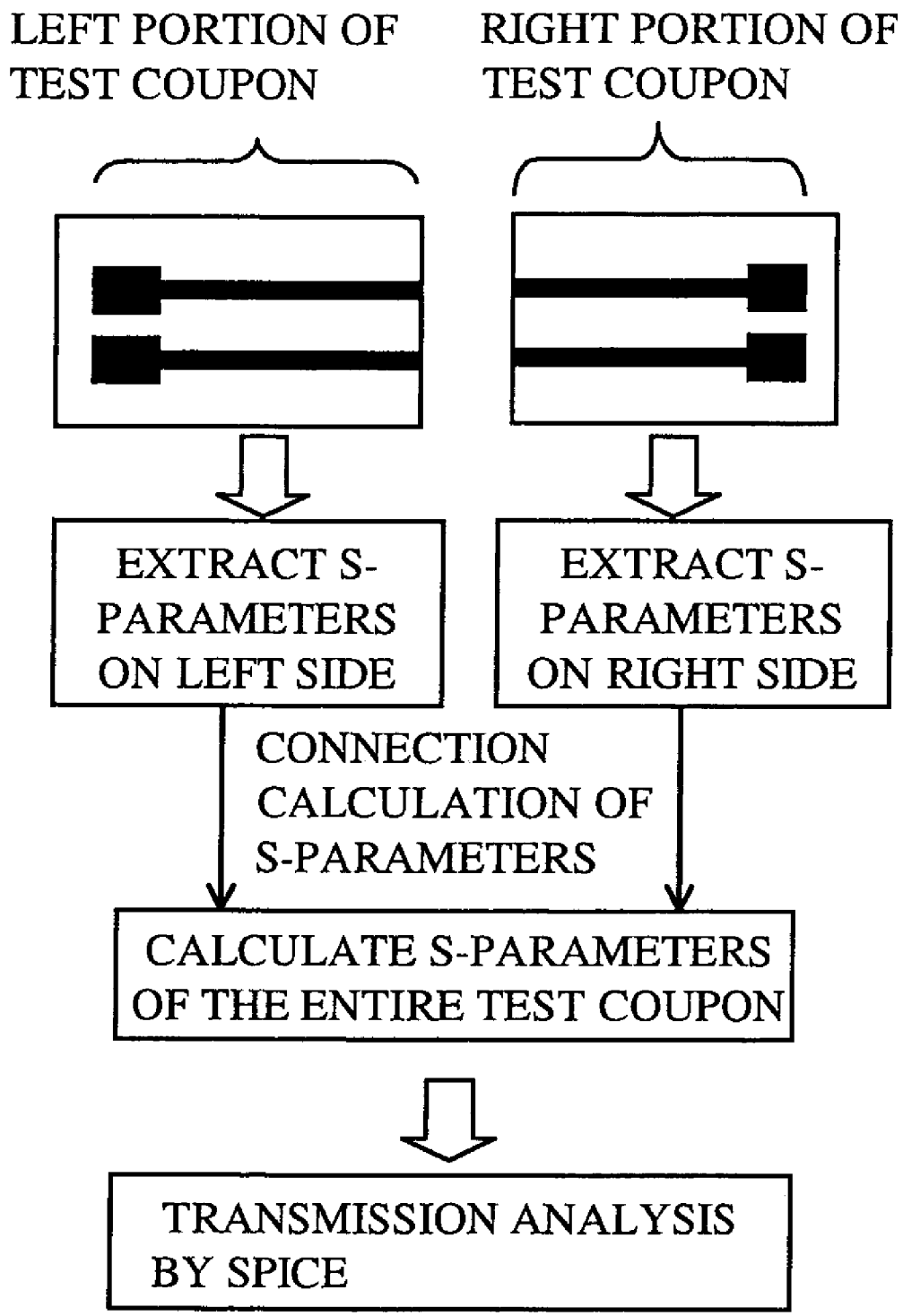
FIG. 1 illustrates a principle of the present invention.

FIG. 2 illustrates an example of the structure of an S-parameter calculation apparatus of the present invention. In the figure, reference numeral 1 denotes an S-parameter calculation apparatus which comprises hardware such as a CPU and memory and a software program, 10 denotes an S-parameter file calculated beforehand for each device. In the S-parameter calculation apparatus 1, reference numeral 11 denotes an S-parameter file input section, 12 denotes a port position correspondence conversion section, 13 denotes an S-parameter/T-parameter conversion section, 14 denotes a connection calculation section, 15 denotes a T-parameter/S-parameter conversion section and 16 denotes an S-parameter file output section.

The S-parameter file input section 11 inputs S-parameters for each device constituting a transmission analysis target system from the S-parameter file 10 provided beforehand. Furthermore, the S-parameter file input section 11 can also input S-parameters by specifying the S-parameter file 10 extracted for part of a cable or wiring and so on, when calculating S-parameters of arbitrary lengths of the cable or wiring and so on.

FIG. 3 illustrates an example of the data structure of the S-parameter file. The S-parameter file 10 stores S-parameters ($S_{11}$ to $S_{44}$), for example, as shown in FIG. 3 for each frequency. A typical data format is a Touchstone format. Here, S-parameters at a certain frequency is expressed as MA=(Magnitude, Angle). In addition to this, there are also notations of DB=(dB, Angle) and RI=(Real, Image) and the present invention is also applicable to S-parameters of other notations.

The port position correspondence conversion section 12 carries out port position correspondence conversion processing which brings the port positions of the S-parameters input from the S-parameter file 10 into correspondence with the port positions in the order preset for a connection calculation and rearranges the S-parameters. This port position correspondence conversion processing will be explained in detail later.

Figure 15:
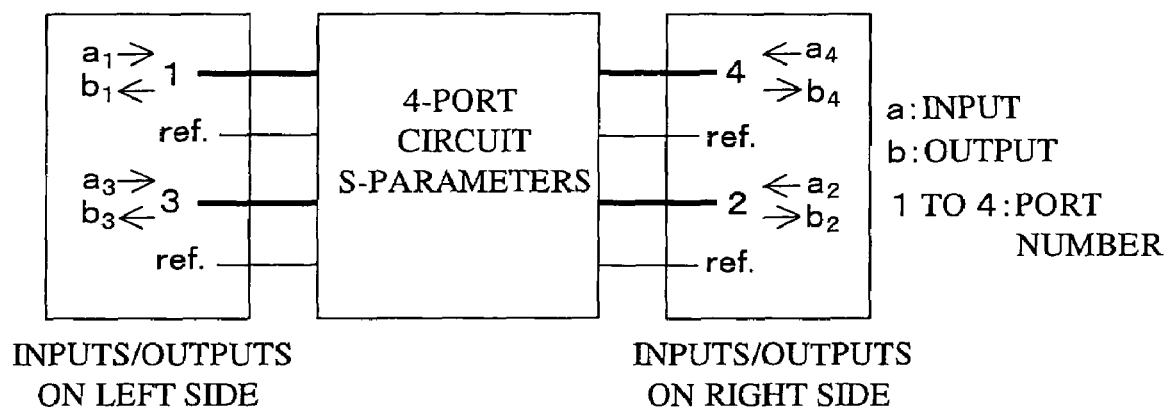
FIG. 15 illustrates an input/output relationship of a circuit with 4 port terminals.
Figure 16:
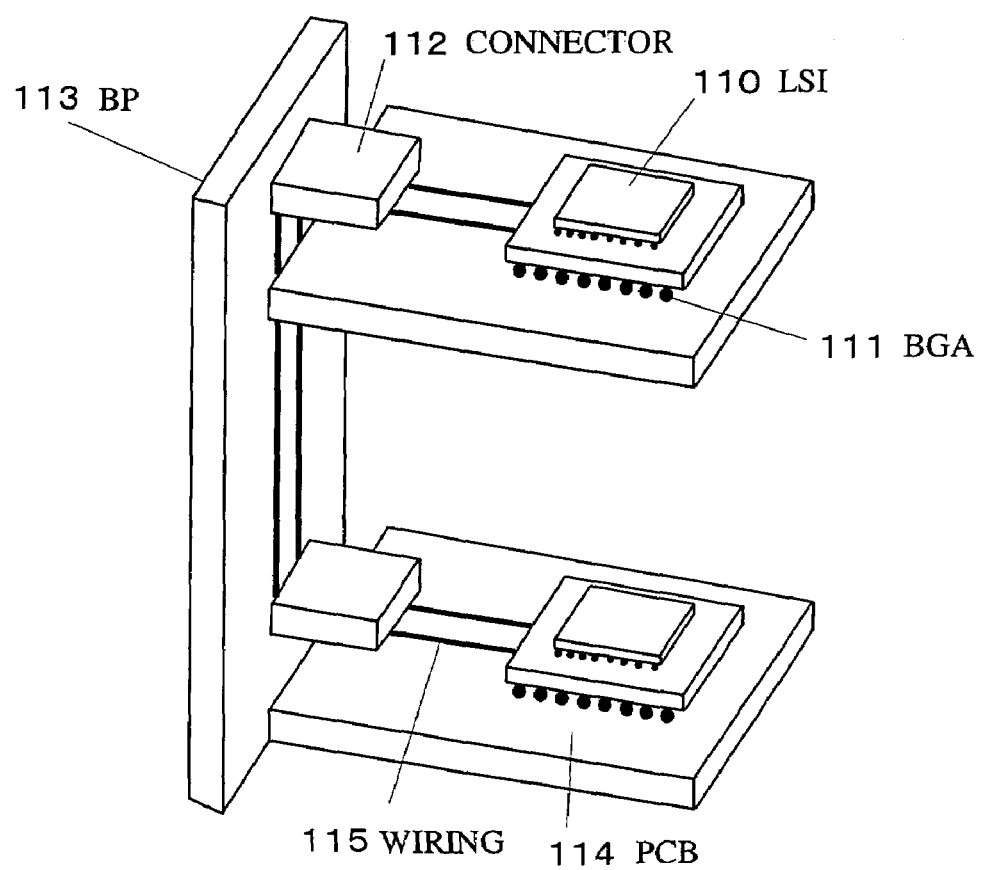
FIG. 16 illustrates an example of a system.
Figure 17:
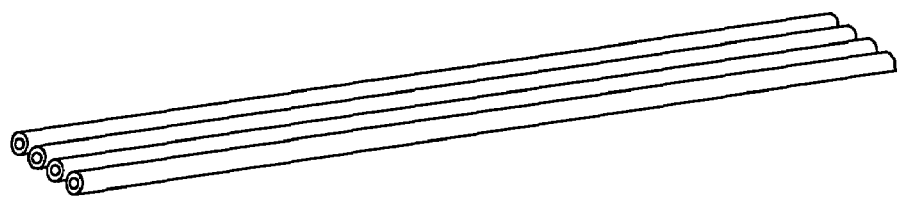
FIG. 17 illustrates wiring or a cable.
Figure 18:
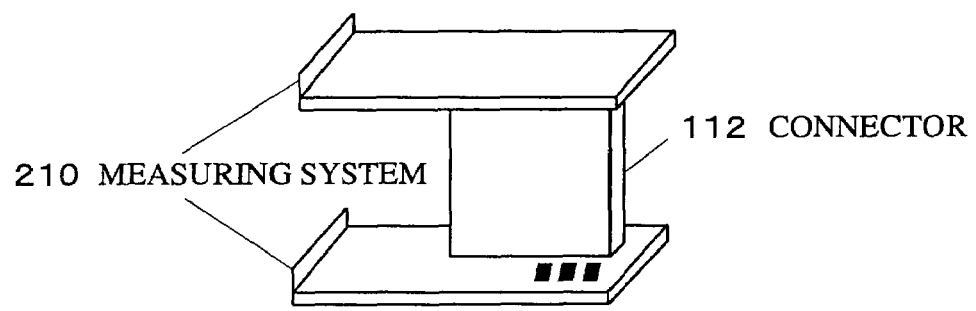
FIG. 18 illustrates an example of measurement of S-parameters of a connector.
Figure 19:
FIG. 19 illustrates connections of S-parameters on a SPICE model.

The S-parameter/T-parameter conversion section 13 converts S-parameters to T-parameters to enable a matrix calculation. For example, as shown in FIG. 4, S-parameters $S_{11}$ to $S_{44}$ are converted to T-parameters $T_{11}$ to $T_{44}$. The T-parameters shown in FIG. 4 are, for example, matrix elements expressing a relationship between the inputs/outputs on the left and the inputs/outputs on the right of the circuit shown in FIG. 15.

The connection calculation section 14 carries out connection calculation of T-parameters obtained by converting S-parameters for each device and obtains T-parameters of the entire system subject to the transmission analysis. The T-parameter/S-parameter conversion section 15 converts T-parameters of the entire system to S-parameters of the entire system. The S-parameter file output section 16 outputs the calculated S-parameters of the entire system.

The connection calculation of S-parameters according to the present invention will be explained in detail. The S-parameter/T-parameter conversion section 13 converts S-parameters of each device to T-parameters as shown in FIG. 4, and thereby enables a circuit to be connected. This is because while an S-parameter shows a relationship between an input and output of a circuit, a T-parameter shows a relationship between an input/output on the left and an input/output on the right of a circuit, and therefore it is possible to perform a connection/separation operation using a matrix calculation.

Figure 5:
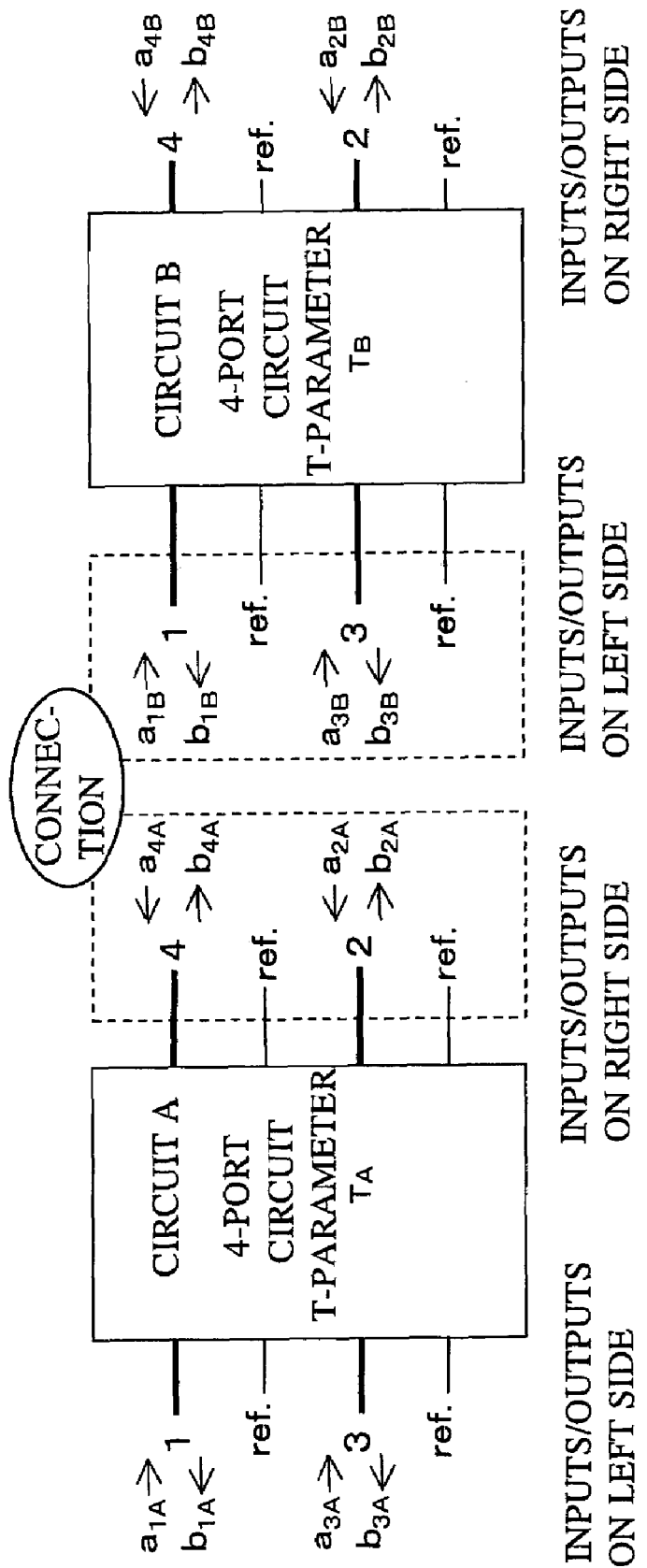
FIG. 5 illustrates the connection of two 4-port circuits.

FIG. 5 illustrates the connection of two 4-port circuits. In FIG. 5, $a_{iA}(1 \leq i \leq 4)$ and $b_{iA}(1 \leq i \leq 4)$ show an input and output of each port from port 1 to port 4 of a circuit A and $a_{iB}(1 \leq i \leq 4)$ and $b_{iB}(1 \leq i \leq 4)$ show an input and output of each port from port 1 to port 4 of a circuit B. A T-parameter of the circuit A is $T_A$ and a T-parameter of the circuit B is $T_B$.

The relationship between inputs/outputs on the left and inputs/outputs on the right of the circuit A is expressed using $T_A$:

$$\begin{pmatrix} b_{1A} \\ b_{3A} \\ a_{1A} \\ a_{3A} \end{pmatrix} = T_A \cdot \begin{pmatrix} a_{4A} \\ a_{2A} \\ b_{4A} \\ b_{2A} \end{pmatrix}$$

and the relationship between inputs/outputs on the left and inputs/outputs on the right of the circuit B is expressed using $T_B$:

$$\begin{pmatrix} b_{1B} \\ b_{3B} \\ a_{1B} \\ a_{3B} \end{pmatrix} = T_B \cdot \begin{pmatrix} a_{4B} \\ a_{2B} \\ b_{4B} \\ b_{2B} \end{pmatrix}$$

When the port 4 of the circuit A is connected to the port 1 of the circuit B and the port 2 of the circuit A is connected to the port 3 of the circuit B:

$$\begin{pmatrix} a_{4A} \\ a_{2A} \\ b_{4A} \\ b_{2A} \end{pmatrix} = \begin{pmatrix} b_{1B} \\ b_{3B} \\ a_{1B} \\ a_{3B} \end{pmatrix}$$

Thus, the relationship between the inputs/outputs on the left and inputs/outputs on the right of the entire circuit after the connections shown in FIG. 5 can be expressed by the matrix calculation shown in Formula 3 below:

$$\begin{pmatrix} b_{1A} \\ b_{3A} \\ a_{1A} \\ a_{3A} \end{pmatrix} = T_A \cdot T_B \cdot \begin{pmatrix} a_{4B} \\ a_{2B} \\ b_{4B} \\ b_{2B} \end{pmatrix} \quad \text{Formula 3}$$

The result of a multiplication of T-parameters $T_A \cdot T_B$ of the two circuits in Formula 3 becomes T-parameters of the entire circuit after the connection. When the T-parameters of this entire circuit after the connection are converted to S-parameters, it is possible to obtain S-parameters of the entire circuit after the connection.

Next, the processing by the port position correspondence conversion section 12 will be explained in detail using FIG. 6A, FIG. 6B and FIG. 7. For measurements of S-parameters, each terminal (port) is numbered. The numbering order is a probe setting order in the case of actual measurement and a port setting order in the case of a three-dimensional electromagnetic field analysis and the numbering order may vary depending on the measurer.

Port numbers are associated with matrix element numbers of S-parameters and a connection requires the same port number arrangement. However, port positions differ between an actual measurement and three-dimensional electromagnetic field analysis. To solve this problem, after S-parameters are input from the S-parameter file, the present invention rearranges the elements of the matrix of the input S-parameters according to the port positions preset by codes (program).

Figure 6A:
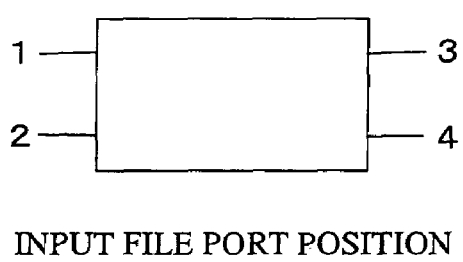
FIG. 6A illustrates input file port positions and an example of S-parameters based on the input file port positions.
Figure 6B:
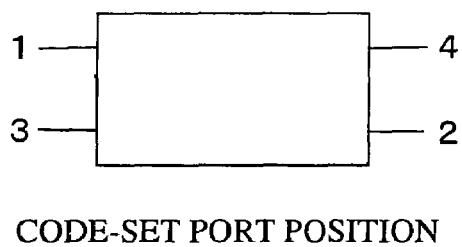
FIG. 6B illustrates code-set port positions and an example of S-parameters based on the code-set port positions.

FIG. 6A shows input file port positions and an example of S-parameters based on the input file port positions and FIG. 6B shows code-set port positions and an example of S-parameters based on the code-set port positions. The left figure in FIG. 6A shows input file port positions which are port positions corresponding to S-parameters of the input file and the right figure in FIG. 6A shows S-parameters based on the port positions in the left figure of the input file. Furthermore, the left figure in FIG. 6B shows code-set port positions which are port positions preset by codes and the right figure in FIG. 6B shows S-parameters based on the code-set port positions.

In a program which performs a connection calculation, calculation processing is performed according to S-parameters arranged according to the port positions (numbers) in FIG. 6B, and therefore it is necessary to convert the elements of S-parameters in the right figure in FIG. 6A input from the S-parameter file as shown in the left figure in FIG. 6B according to the code-set port positions and use the converted S-parameters ($S_{11}$ to $S_{44}$). The port position correspondence conversion section 12 displays the port number input screen shown in FIG. 7, inputs the port position correspondence information from the user and performs conversion processing of positions of the S-parameter elements.

Figure 7:
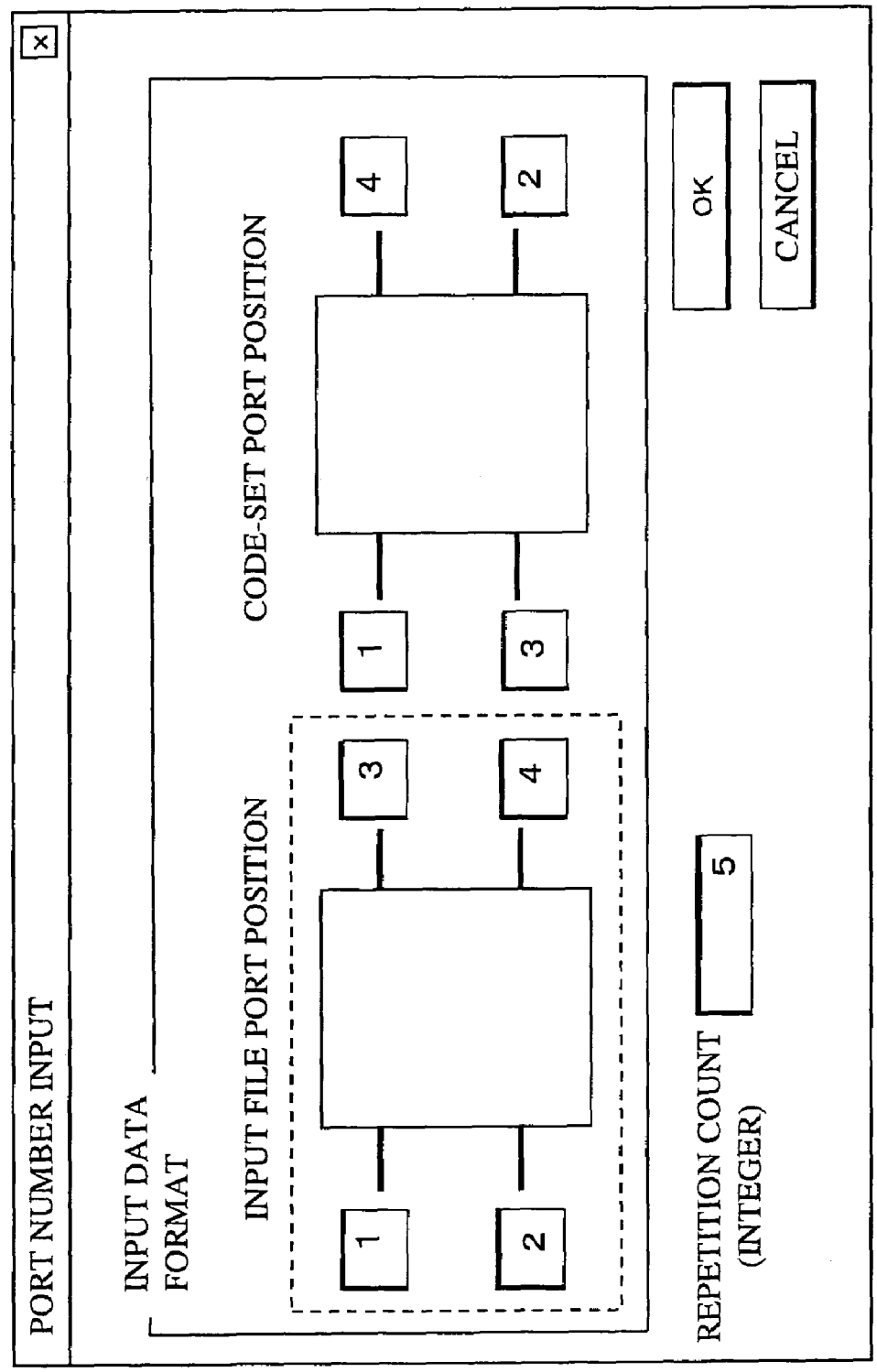
FIG. 7 shows an example of a port number input screen.

FIG. 7 shows an example of the port number input screen for port position correspondence conversion processing. The code-set port positions which are the same port positions as those on the left figure in FIG. 6B are shown on the right side in the input screen in FIG. 7.

In the input file port position setting screen enclosed by a dotted line in FIG. 7, the user inputs port numbers from 1 to 4 at the four port positions. By inputting port numbers, in FIG. 7, for example, the same port positions as those in the left figure in FIG. 6A are set. The S-parameters corresponding to these input file port positions are shown in the right figure in FIG. 6A. If the user clicks on the "OK" button after setting the input file port positions, the arrangement of the S-parameters shown in the right figure in FIG. 6A is converted to S-parameters ($S_{11}$ to $S_{44}$) in the right figure in FIG. 6B.

In the present invention, S-parameters of the input file are converted according to the code-set port positions. Therefore, S-parameters can be connected even when the input S-parameter file corresponds to different port positions. In the present invention, it is possible to connect actually measured values and analysis values of S-parameters by carrying out the above described port position correspondence conversion processing.

Figure 8:
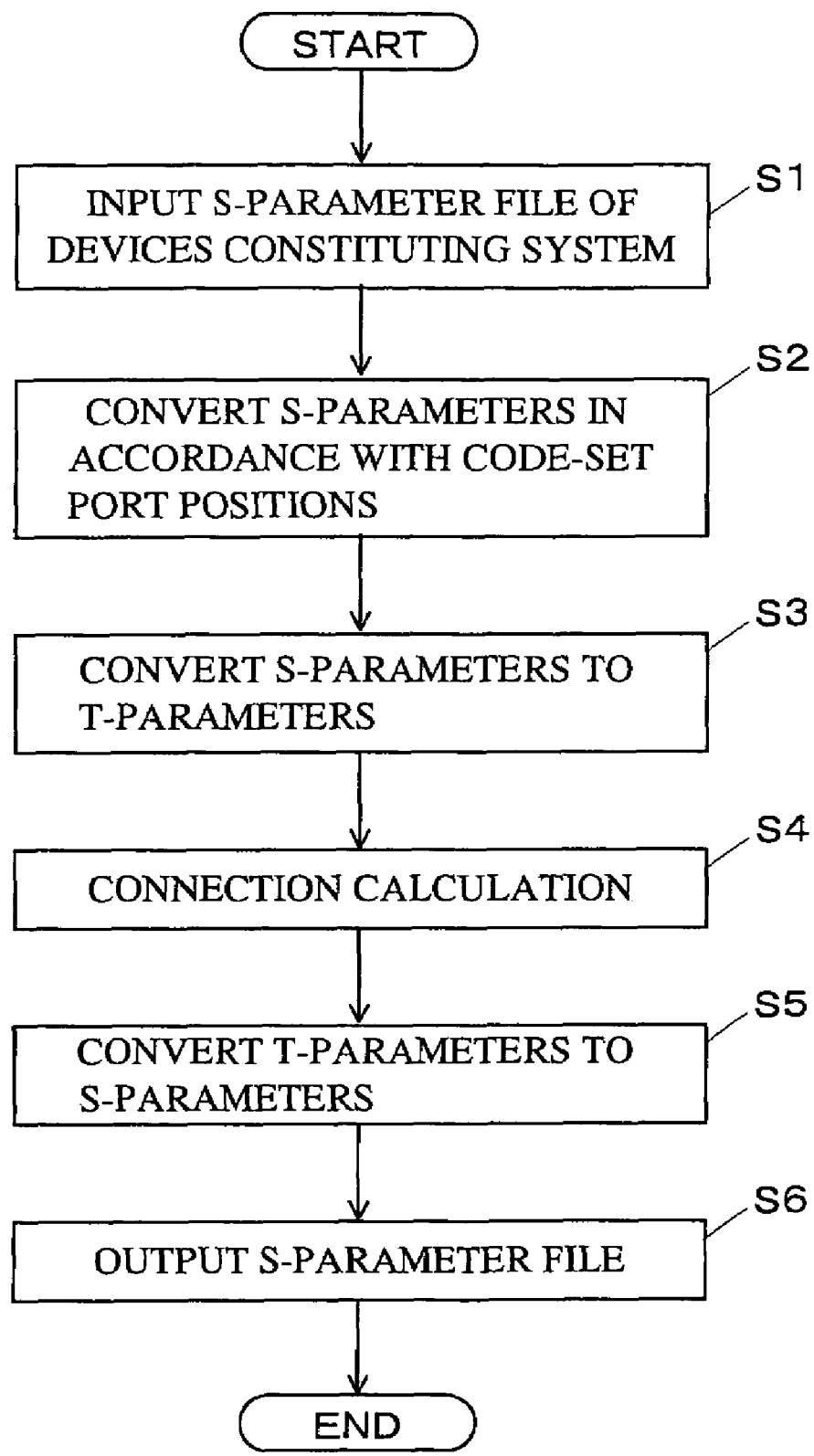
FIG. 8 illustrates a connection process flow of different S-parameters.

FIG. 8 illustrates a connection process flow of S-parameters according to the present invention. First, an S-parameter file of devices constituting a system obtained by an actual measurement or three-dimensional electromagnetic field analysis is input (step S1). Next, in order to allow connections combining the actually measured values and analysis values, S-parameters are converted in accordance with the code-set port positions (step S2).

S-parameters are converted to T-parameters to which a matrix calculation is applicable (step S3). Then, a connection calculation is performed using Formula 3 (step S4). The T-parameters calculated as a result of the connection calculation are converted to S-parameters (step S5) and the calculated S-parameters are output as a file (step S6) and the processing is terminated.

In the above described processing, the calculation time to calculate the S-parameters of the entire system having two devices was approximately 10 sec to 20 sec. From this, it is clear that even when the number of devices increases, it is possible to calculate the S-parameters in a relatively short time.

As described above, the present invention connects S-parameters for each device through a multiplication of a complex matrix (matrix made up of T-parameters). The scope of the present invention is not limited to circuits with four terminals or eight terminals, but also applicable to circuits with more ports.

Figure 9:
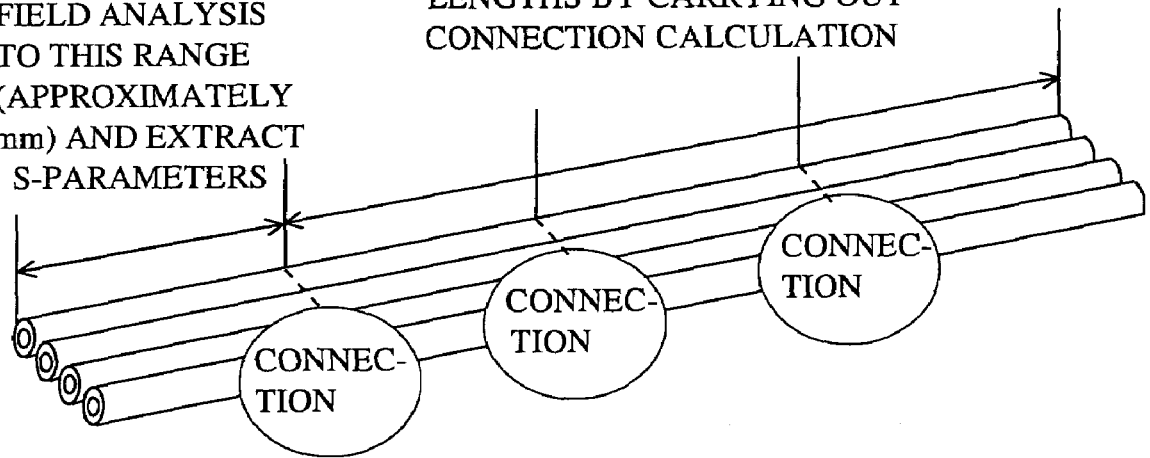
FIG. 9 illustrates a calculation of S-parameters of arbitrary lengths.

Next, S-parameter calculation processing of wiring/cable of an arbitrary length using the present invention will be explained. As shown in FIG. 9, the present invention connects an S-parameter file obtained as a result of carrying out a three-dimensional electromagnetic field analysis on, for example, a cable having a length of approximately 5 mm to calculate S-parameters of a cable having an arbitrary length. According to the present invention, it is possible to calculate S-parameters of arbitrary lengths by using S-parameters of the length of a portion of a cable or wiring and so on in a short time.

Figure 10:
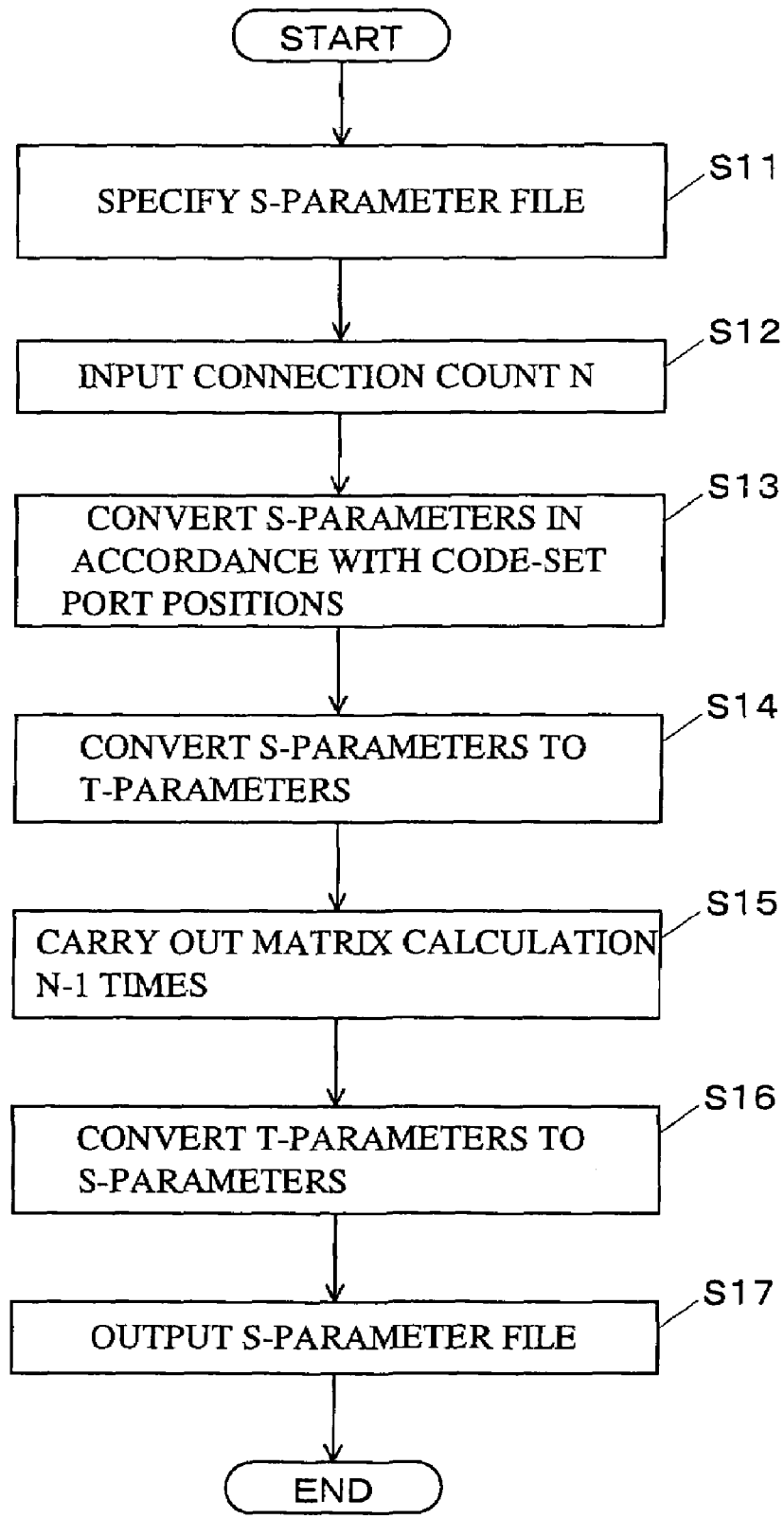
FIG. 10 illustrates an example of an S-parameter calculation process flow of a cable of an arbitrary length.

FIG. 10 illustrates an example of an S-parameter calculation process flow of a cable of an arbitrary length. First, an S-parameter file storing S-parameters having the length of a portion of the cable is specified (step S11), a connection count N is input (step S12) and S-parameters are converted in accordance with the code-set port positions (step S13).

For example, on the port number input screen shown in FIG. 7, an arbitrary connection count N ("5" in FIG. 7) is input in the "repetition count (integer)" and port numbers from 1 to 4 are input on the input file port position setting screen indicated by the area enclosed by the dotted line to execute steps S12, S13.

Next, the S-parameters are converted to T-parameters (step S14). Next, the matrix calculation expressed by Formula 3 is carried out N−1 times (step S15) to obtain T-parameters having a desired length. The T-parameters obtained are converted to S-parameters (step S16), the S-parameters of arbitrary lengths obtained are output as a file (step S17) and the processing is terminated.

As shown above, the present invention can calculate S-parameters of a cable of an arbitrary length, and so on, through repetitive calculations of a complex matrix made up of T-parameters and is applicable even when the number of ports is increased just as in the case of a connection of the aforementioned device.

Figure 11:
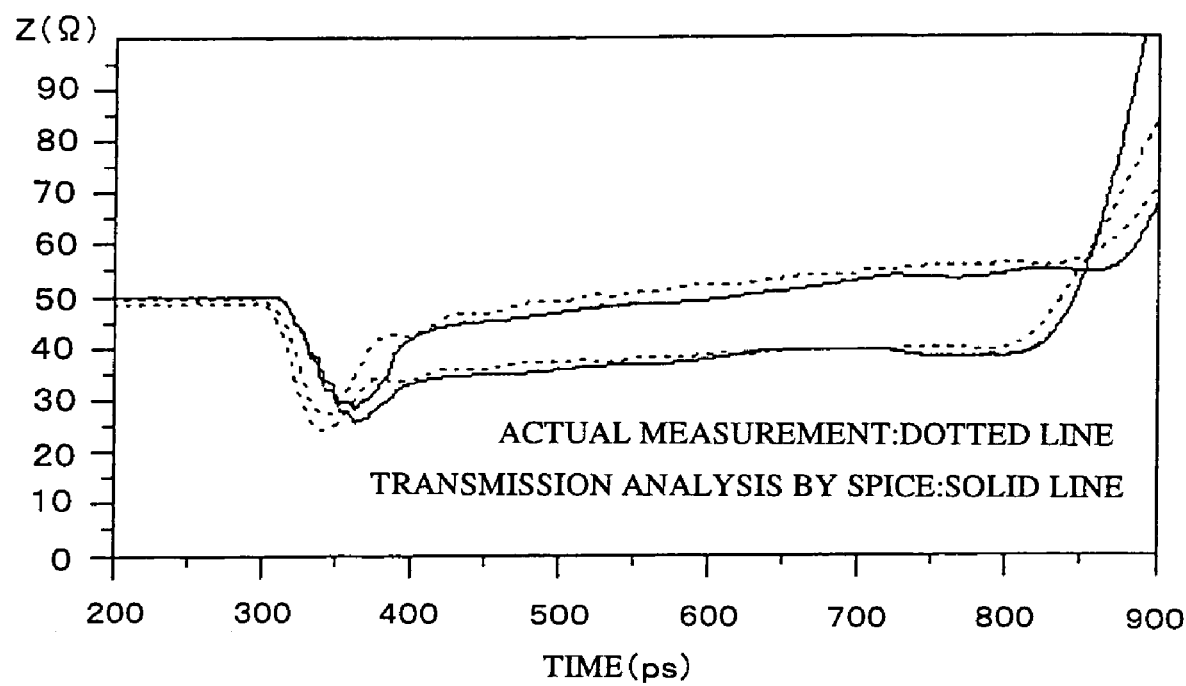
FIG. 11 illustrates an application example of the present invention.
Figure 20A:
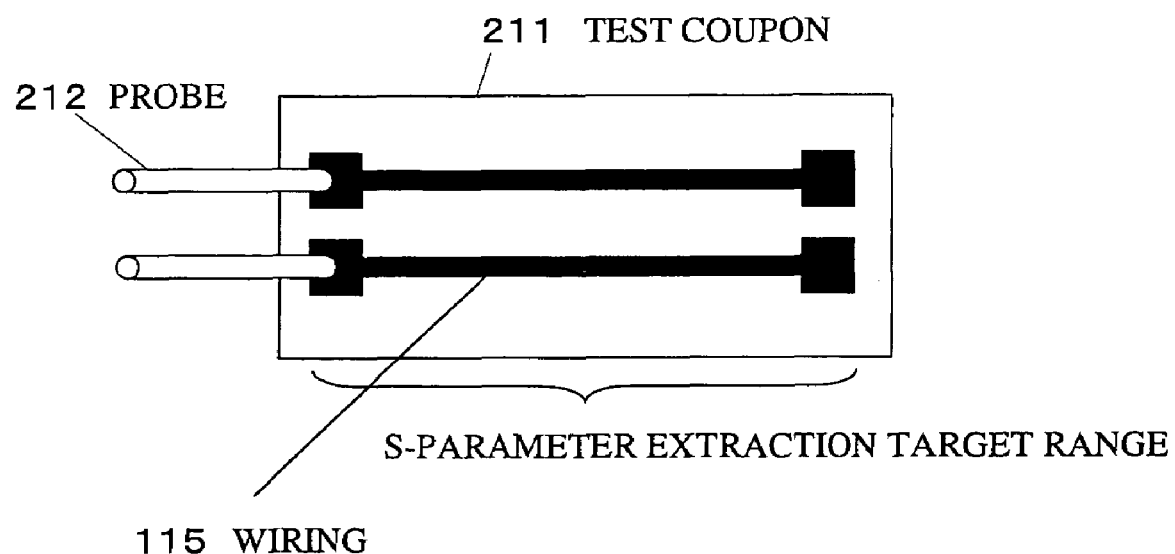
FIG. 20A illustrates a test coupon.
Figure 20B:
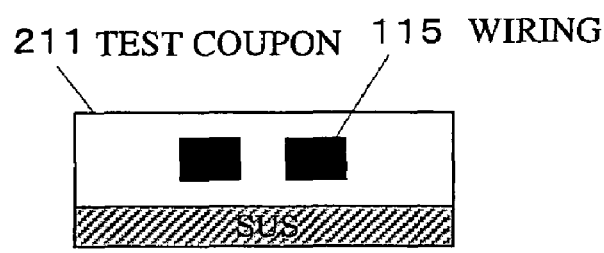
FIG. 20B is a cross-sectional view of the test coupon.
Figure 21:
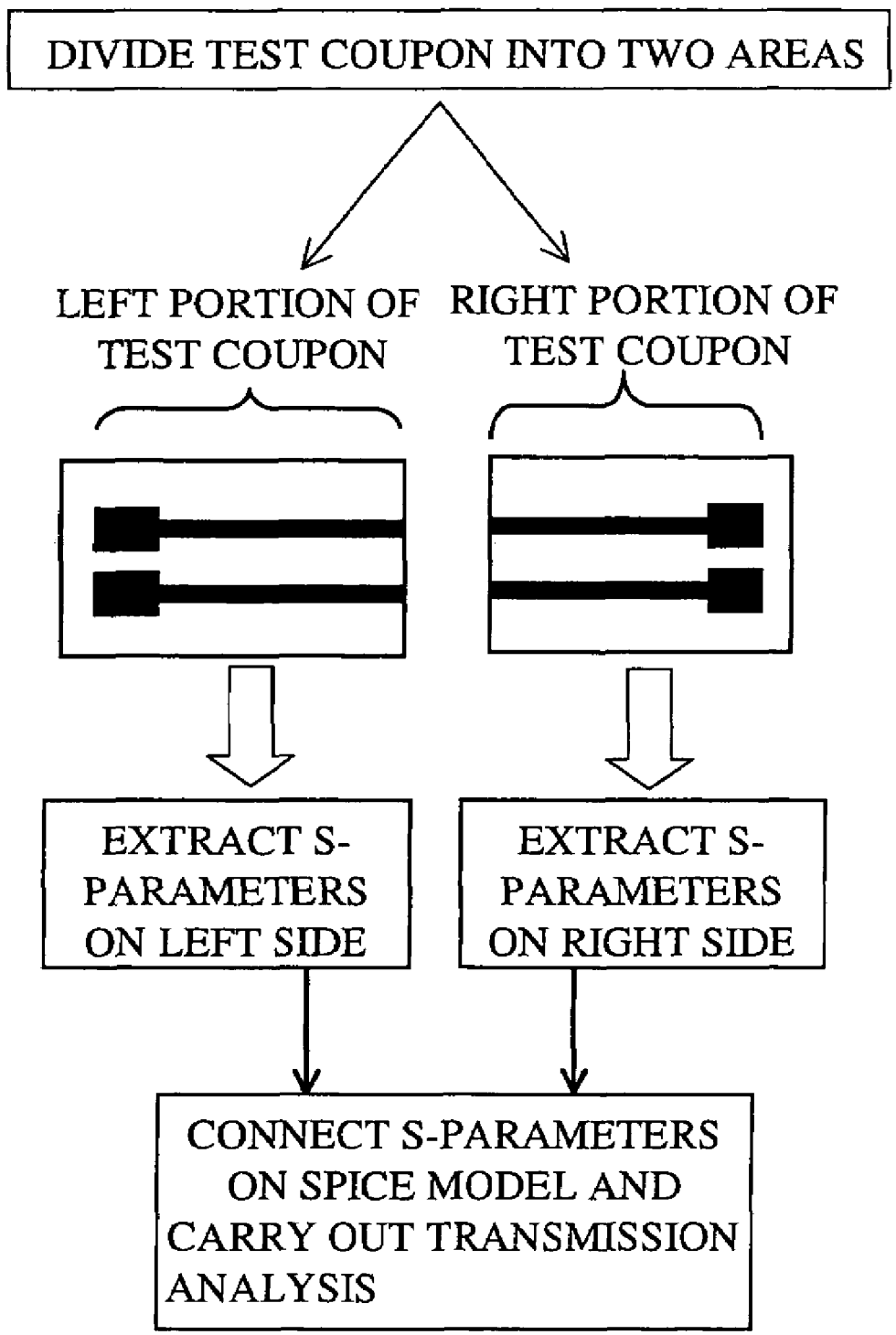
FIG. 21 illustrates a principle of a conventional technology.

FIG. 11 illustrates a comparison between the result of a transmission analysis by SPICE using S-parameters calculated according to the present invention and actually measured values. In this experiment, the test coupon 211 shown in FIG. 20A is divided into the left portion and right portion as shown in FIG. 1, S-parameters measured by actual measurements of both portions are connected using the S-parameter calculation method according to the present invention and a SPICE transmission analysis is performed using the S-parameters calculated for the entire test coupon 211.

Figure 22:
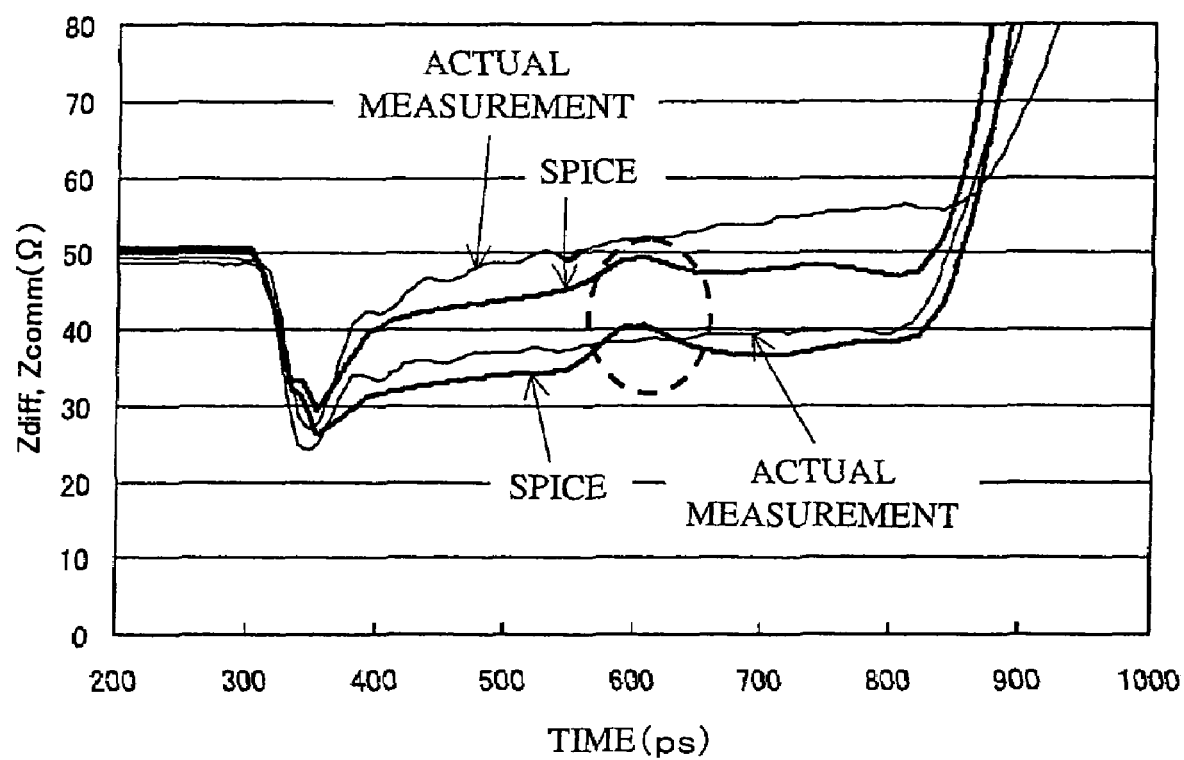
FIG. 22 illustrates a transmission analysis result using the conventional technology.

In the figure, dotted liens show the results of actual measurements of the entire test coupon 211 and solid lines show the results of the transmission analysis by SPICE. The results of the SPICE transmission analysis match the actual measurements well and no waveform disturbance is observed. As is evident from a comparison with the results of the transmission analysis using the conventional technology shown in FIG. 22, that is, the result of converting S-parameters of the left portion and right portion of the test coupon 211 into SPICE models and carrying out a transmission analysis, it is possible to perform a more accurate transmission analysis through a transmission analysis using S-parameters of the entire system calculated by the present invention.

Figure 12A:
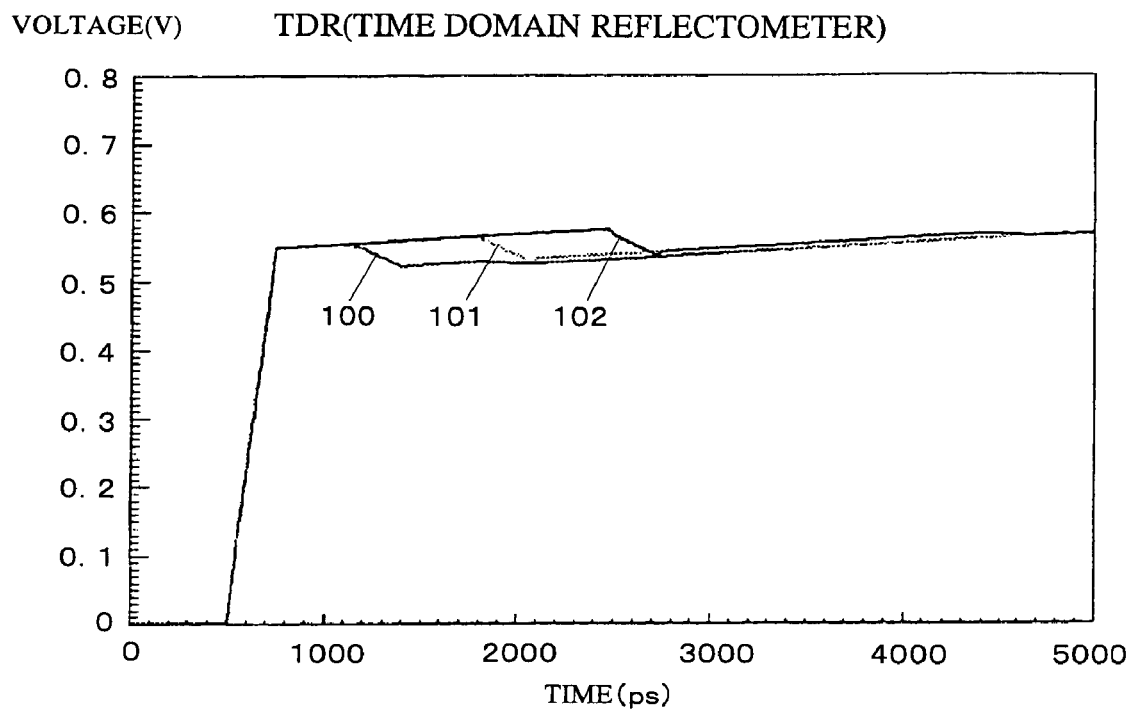
FIG. 12A illustrates a reflection characteristic when calculating S-parameters of a micro strip line.
Figure 12B:
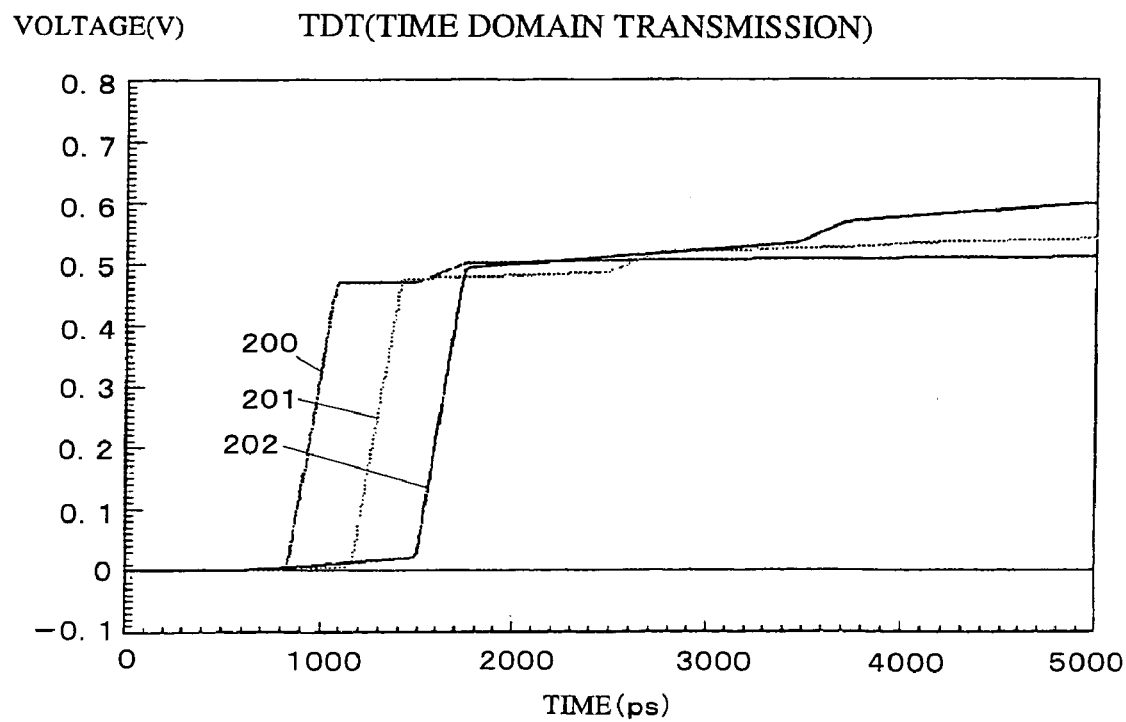
FIG. 12B illustrates a transmission characteristic when calculating S-parameters of a micro strip line.
Figures 13, 14:
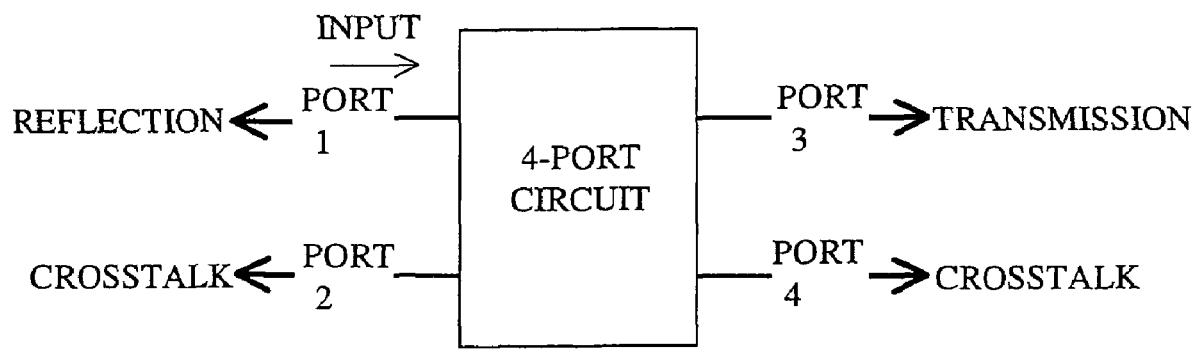
FIG. 13 illustrates an input/output relationship of a circuit.
FIG. 14 illustrates S-parameters.

FIG. 12A and FIG. 12B show results of a transient analysis after conducting a connection calculation according to the present invention on S-parameters of a 5 cm micro strip line obtained using a three-dimensional electromagnetic field analysis and calculating S-parameters of micro strip lines having a double length (10 cm) and triple length (15 cm).

The fall of voltage 100 in FIG. 12A shows a reflection characteristic when S-parameters of a 5 cm micro strip line are obtained using a three-dimensional electromagnetic field analysis, the fall of voltage 101 shows a reflection characteristic when S-parameters are connected and S-parameters of a micro strip line having a double length are obtained and the fall of voltage 102 shows a reflection characteristic when S-parameters are connected and S-parameters of a micro strip line having a triple length are obtained.

On the other hand, the rise of voltage 200 in FIG. 12B shows a transmission characteristic when S-parameters of a 5 cm micro strip line are obtained using a three-dimensional electromagnetic field analysis, the rise of voltage 201 shows a transmission characteristic when S-parameters are connected and S-parameters of a micro strip line having a double length are obtained and the rise of voltage 202 shows a transmission characteristic when S-parameters are connected and S-parameters of a micro strip line having a triple length are obtained.

With respect to reflection, as is evident from FIG. 12A, the timing of a voltage fall delays as the length of a micro strip line increases, and with respect to transmission, as is evident from FIG. 12B, the timing of a voltage rise delays as the length of a micro strip line increases.

Furthermore, the time interval between the fall timing of the voltage 100 and fall timing of the voltage 101 is equal to the time interval between the fall timing of the voltage 101 and the fall timing of the voltage 102, and the time interval between the rise timing of the voltage 200 and the rise timing of the voltage 201 is equal to the time interval between the rise timing of the voltage 201 and the rise timing of the voltage 202.

Therefore, it is evident that S-parameters are connected correctly according to the present invention. From this, it can be said that connections of S-parameters according to the present invention allow S-parameters of arbitrary lengths of a cable to be calculated accurately.

The S-parameter calculation processing according to the present invention described so far can be realized using a computer and a software program and it is also possible to provide the program recorded in a computer-readable recording medium or provide the program over a network.

What is claimed is:

1. An S-parameter calculation apparatus for calculating S-parameters of a single device having a length N times a certain length L, wherein N represents an arbitrary integer of value of 2 or more, the apparatus comprising:
    an input unit inputting the S-parameters of said single device having a length of L;
    a port position correspondence conversion unit converting the input S-parameters so as to correspond to preset port positions when said single device is connected;
    a S-parameter/T-parameter conversion unit converting said converted S-parameters to T-parameters;
    a calculation unit carrying out a matrix calculation using said T-parameters, repeating (N−1) times a process of calculating T-parameters of a single device having a length corresponding to the length of said single devices having a length of L sequentially connected and calculating T-parameters of a single device having a length of L×N;
    a T-parameter/S-parameter conversion unit converting said calculated T-parameters of said single device having a length of L×N to S-parameters of a single device having a length of L×N; and
    an output unit outputting S-parameters of said single device having the length of L×N obtained by said T-parameter/S-parameter conversion unit.

2. The S-parameter calculation apparatus according to claim 1, wherein said port position correspondence conversion unit displays a screen to input information on the correspondence between port positions of a device corresponding to the input S-parameters and preset port positions of the device for a connection calculation and rearranges the input S-parameters based on the correspondence information input from the input screen.

3. A method for calculating S-parameters of a single device having a length N times a certain length L using a computer, wherein N represents an arbitrary integer of value of 2 or more, the method comprising:
    inputting the S-parameters of said single device having a length of L;
    converting the input S-parameters so as to correspond to preset port positions when said single device is connected;
    converting said converted S-parameters to T-parameters;
    carrying out a matrix calculation using said T-parameters, repeating (N−1) times a process of calculating T-parameters of a single device having a length corresponding to the length of said single devices having a length of L sequentially connected and calculating T-parameters of a single device having a length of L×N;
    converting said calculated T-parameters of said single device having a length of L×N to S-parameters of a single device having a length of L×N; and
    outputting S-parameters of the single device having the length of L×N obtained by converting said T-parameters to S-parameters.

4. A computer-readable recording medium for recording an S-parameter calculation program for calculating S-parameters of a single device having a length N times a certain length L using a computer, wherein N represents an arbitrary integer of value of 2 or more, the program causing the computer to execute:

inputting S-parameters of said single device having a length of L;

converting the input S-parameters so as to correspond to preset port positions when said single device is connected;

converting said converted S-parameters to T-parameters;

carrying out a matrix calculation using said T-parameters, repeating (N−1) times a process of calculating T-parameters of a single device having a length corresponding to the length of said single devices having a length of L sequentially connected and calculating T-parameters of a single device having a length of L×N;

converting said calculated T-parameters of said single device having a length of L×N to S-parameters of a single device having a length of L×N; and outputting S-parameters of the single device having the length of L×N obtained by converting said T-parameters to S-parameters.

5. An input/output characteristic analysis apparatus to analyze input/output characteristics of an entire system made up of a plurality of same or different devices using S-parameters, the apparatus comprising:

a unit calculating S-parameters of the entire system from S-parameters of the individual devices using the S-parameter calculation apparatus; and for a unit analyzing the input/output characteristics through SPICE using the calculated S-parameters of the entire system, wherein the S-parameter calculation apparatus which calculates S-parameters of a device having a length N times a certain length L, wherein N represents an arbitrary integer of value of 2 or more, further comprises:

an input unit inputting the S-parameters of said individual device having a length of L;

a port position correspondence conversion unit converting the input S-parameters so as to correspond to preset port positions when said individual device is connected;

a S-parameter/T-parameter conversion unit converting said converted S-parameters to T-parameters;

a calculation unit carrying out a matrix calculation using said T-parameters, repeating (N−1) times a process of calculating T-parameters of a device having a length corresponding to the length of said individual devices having a length of L sequentially connected and calculating T-parameters of a device having a length of L×N;

a T-parameter/S-parameter conversion unit converting said calculated T-parameters of said device having a length of L×N to S-parameters of a device having a length of L×N; and an output unit outputting S-parameters of said device having the length of L×N obtained by said T-parameter/S-parameter conversion unit.

\* \* \* \* \*